United States Patent
Belling et al.

(10) Patent No.: US 11,791,618 B2
(45) Date of Patent: Oct. 17, 2023

(54) DEVICE AND METHOD FOR CONTROLLING THE CURRENT OF AN ACTUATOR

(71) Applicant: Knorr-Bremse Systeme Fuer Nutzfahrzeuge GmbH, Munich (DE)

(72) Inventors: Michael Belling, Renningen (DE); Christian Kaufmann, Sindelfingen (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 92 days.

(21) Appl. No.: 17/594,516

(22) PCT Filed: Apr. 23, 2020

(86) PCT No.: PCT/EP2020/061297
§ 371 (c)(1),
(2) Date: Oct. 20, 2021

(87) PCT Pub. No.: WO2020/233937
PCT Pub. Date: Nov. 26, 2020

(65) Prior Publication Data
US 2022/0209524 A1 Jun. 30, 2022

(30) Foreign Application Priority Data
May 17, 2019 (DE) .................... 10 2019 113 139.1

(51) Int. Cl.
*H02H 3/32* (2006.01)
*B60R 16/023* (2006.01)
*G01R 19/165* (2006.01)

(52) U.S. Cl.
CPC .......... *H02H 3/32* (2013.01); *B60R 16/0232* (2013.01); *G01R 19/165* (2013.01)

(58) Field of Classification Search
CPC .......... H02H 3/32; H02H 3/05; H02H 1/0007; H02H 3/08; H02H 7/00; B60R 16/0232; B60R 16/02; G01R 19/165
See application file for complete search history.

(56) References Cited

U.S. PATENT DOCUMENTS

2003/0095366 A1* 5/2003 Pellegrino ................. H02J 1/10
361/93.1
2007/0013382 A1 1/2007 Hinz et al.
(Continued)

FOREIGN PATENT DOCUMENTS

CN 1586028 A 2/2005
CN 101065596 A 10/2007
(Continued)

OTHER PUBLICATIONS

International Search Report for PCT/EP2020/061297 dated Oct. 2, 2020.

Primary Examiner — Akm Zakaria
(74) Attorney, Agent, or Firm — NORTON ROSE FULBRIGHT US LLP; Gerard Messina (57) ABSTRACT

A device for controlling a current of an actuator, including: at least one control unit having a first terminal; a first switch; a second terminal; and a second switch for controlling a flow of current through the actuator via the first terminal and the second terminal independently of one another; a first current measuring apparatus for measuring a first current through the first terminal; and a second current measuring apparatus for measuring a second current through the second terminal; in which the first current measuring apparatus and the second current measuring apparatus are integrated into the at least one control unit so that fault currents can be acquired. Also described are a related electronic control unit, a commercial vehicle, and a method.

9 Claims, 5 Drawing Sheets

(56) References Cited

U.S. PATENT DOCUMENTS

| | | |
|---|---|---|
| 2012/0274131 A1 | 11/2012 | Makino |
| 2012/0323436 A1* | 12/2012 | Grieser-Schmitz ... B60T 13/662 |
| | | 701/34.4 |
| 2013/0300430 A1 | 11/2013 | Lindsay et al. |
| 2014/0306632 A1* | 10/2014 | Je .......................... H02P 6/182 |
| | | 318/400.34 |
| 2016/0200196 A1 | 7/2016 | Michaelides et al. |
| 2017/0108544 A1 | 4/2017 | Schmelzer |

FOREIGN PATENT DOCUMENTS

| | | |
|---|---|---|
| CN | 103069524 A | 4/2013 |
| CN | 104620087 A | 5/2015 |
| CN | 105738750 A | 7/2016 |
| CN | 108352239 A | 7/2018 |
| DE | 102007046488 A1 | 4/2009 |
| DE | 102015215035 A1 | 2/2017 |
| JP | 2011100199 A | 5/2011 |
| JP | 6469596 B2 | 2/2019 |
| WO | 2018069074 A1 | 4/2018 |
| WO | 2019082647 A1 | 5/2019 |

\* cited by examiner

PRIOR ART

Fig. 5

DEVICE AND METHOD FOR CONTROLLING THE CURRENT OF AN ACTUATOR

FIELD OF THE INVENTION

The present invention relates to a device and a method for controlling the current of an actuator and, in particular, to a circuit for measuring the current of a control unit of an actuator system in vehicles.

BACKGROUND INFORMATION

Actuators are, in many cases, regulated by electronic control units using voltage control (dU/dt). Current regulation (I) is also possible, but is, however, relatively expensive or complex in comparison with voltage control, since additional electrical circuits are used for this purpose. The regulation by way of the current can be achieved using intelligent output stages with (imprecise) integrated current measurement, or also by a subsequent electrical circuit for measurement of the current current. In conventional systems, a simple current measurement using a shunt on the voltage side is sufficient here, since the actuator is driven via a line and the reference potential is defined in the control unit.

Figure 5:
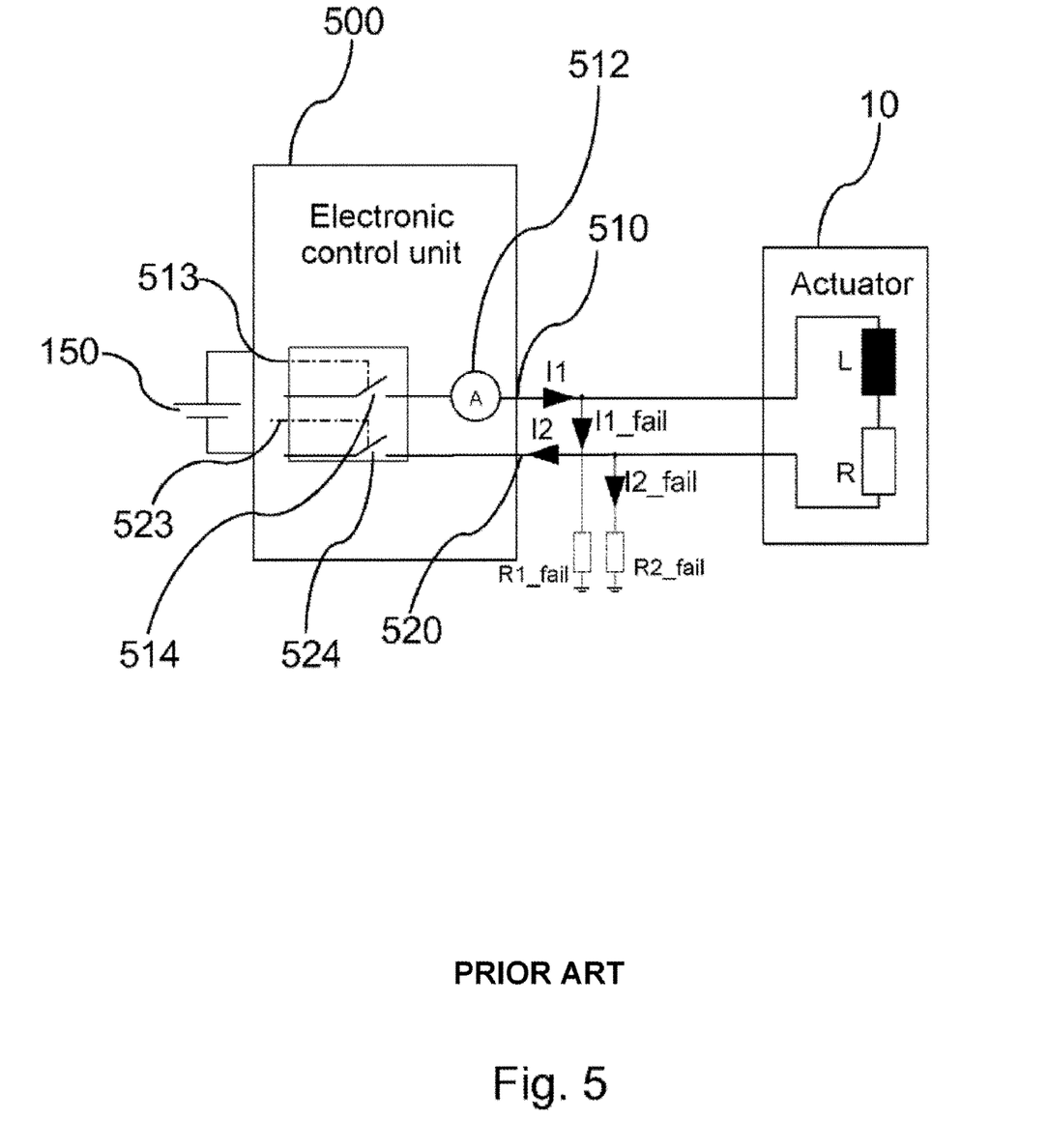
FIG. 5 shows a conventional device for controlling current.

FIG. 5 shows a device for current control as is believed to be already known. This is what is understood as a one-system current measurement, since only one control unit is used for the drive.

In such a system, the device comprises a control unit 500 that is supplied with electrical current from a voltage source 150. The control unit 500 comprises a first terminal 510 and a second terminal 520, between which an actuator 10 is connected. The current I1 flows, for example, out of the first terminal 510, into the actuator 10, and a return current I2 flows through the second terminal 520 back into the control unit 500. The first terminal 510 is connected via a first switch 514 to the voltage source 150, so that the current I1 is provided through the first terminal 510 by closing the first switch 514. The second terminal 520 is also connected via a second switch 524 to the voltage source 150 or to its ground connection. By connecting the second terminal 524, the current I2 can be diverted through the second terminal 520.

In the conventional device illustrated, a current measuring apparatus 512, which measures the current I1 flowing out of the first terminal 510, is also formed. In the conventional device, however, the resolution is not sufficiently exact to create a dynamic control loop for current regulation. It is only used for short-circuit detection.

A portion of the outgoing current I1 can, however, as a result of defects upstream or downstream of the actuator 10, flow away (e.g. to ground or to another voltage level). These loss currents or fault currents are illustrated schematically by I1_fail or I2_fail, and can flow away, for example, via fault resistors R1_fail or R2_fail from the first terminal 510 or the second terminal 520 to the ground potential or, also, to a battery voltage (an arbitrary potential can be simulated with R1_fail or R2_fail). These currents are governed by:

$$I_1 = I_2 + I_{1\_fail} + I_{2\_fail}.$$

Since the fault currents are not, in general, known, this can result in faults in the control of the actuator 10. This problem is exacerbated when multiple control units drive one actuator.

There is therefore a need for improvement in the monitoring of actuators.

SUMMARY OF THE INVENTION

These problems may be at least partially solved by a device for controlling the current of actuators as described herein and a corresponding method as described herein. The further descriptions herein define further advantageous embodiments of the objects of the main descriptions herein.

The present invention relates to a device for controlling the current of an actuator. The device comprises at least one control unit having a first terminal, a first switch, a second terminal, and a second switch for controlling a flow of current through the actuator via the first terminal and the second terminal independently of one another. The device further comprises a first current measuring apparatus for measuring a first current through the first terminal and a second current measuring apparatus for measuring a second current through the second terminal. The first current measuring apparatus and the second current measuring apparatus are integrated into the at least one control unit so that fault currents can be acquired.

The drive of the actuator comprises, in the simplest case, opening or closing the corresponding switches, but can also include a deliberate setting of a desired or required current level in order in this way to implement the current regulation.

The device optionally comprises an evaluation unit that is configured to compare the first current and the second current, and to output a fault signal if the comparison indicates a fault current.

The fault signal can depend on a difference signal between the first current and the second current, and the evaluation unit can optionally be configured to output the fault signal if the difference signal exceeds a predefined threshold value. Since the electrical current cannot disappear, a difference signal that differs from zero is an indication that current is leaking. Reactions are advisable if this leakage exceeds a tolerable amount (definable by the threshold value). The drive could at least then be changed to be sure that the actuator continues to fulfil the desired function.

The first terminal can be configured as a high-side terminal and the second terminal can be configured as a low-side terminal. The first current measuring apparatus moreover optionally comprises a current mirror and/or a first shunt resistor to generate a first voltage value. The second current measuring apparatus can comprise a second shunt resistor to generate a second voltage value, so that the fault current can be based on a difference between the first voltage value and the second voltage value. The high-side and low-side relate to electrical voltage levels. Thus, for example, the ground can be defined as the low-side, from which the high-side represents an excitation level (higher voltage level). Since, however, various voltage potentials can be present in a vehicle, the low-side potential does not necessarily have to be ground, but merely correspond to a reference potential.

The difference signal can therefore be ascertained by a comparator on the basis of voltage values, wherein the individual currents are converted into the corresponding voltage values by using the shunt resistors. The evaluation unit can comprise analysis logic, for example being integrated or implemented as separate logic circuitry, for the purposes of the evaluation.

The device optionally comprises a first control unit and a second control unit (part of the at least one control unit), each of which can be or is connected to the actuator and is configured in order to drive the actuator independently via switchable terminals. The first control unit and the second control unit can each comprise a first current measuring apparatus and a second current measuring apparatus in order to acquire respectively the first current through the respective first terminal and the second current through the respective second terminal independently.

The first control unit is optionally configured as a primary control unit, and the second control unit is optionally configured as a secondary control unit. In this way, simultaneous drive of the actuator should be prevented, or, in the event of a failure or fault in the first control unit, the drive of the actuator can be ensured/prioritized by the second control unit.

The first control unit and the second control unit can each comprise a first switch for switching through the respective first terminal (e.g. to one or to different current supplies). Equally, the first control unit and the second control unit can each comprise a second switch for switching through the respective second terminal (e.g. to one or to different current supplies). The evaluation unit optionally comprises logic that is configured to detect a fault through a measurement of currents through the two first current measuring apparatuses and through the two second current measuring apparatuses when in the following switch states: (i) both the first switches and one of the two second switches are closed; or (ii) both the second switches and one of the two first switches are closed. The other switch is in each case open.

Optionally, a first voltage supply for the first control unit and a second voltage supply for the second control unit are present, wherein the first and the second voltage supply can be independent of one another.

Further exemplary embodiments relate to an electronic control unit (ECU) for a vehicle which can, in particular, be a commercial vehicle. The electronic control unit comprises one of the devices defined previously.

Further exemplary embodiments relate to a commercial vehicle with one of the previously defined electronic control units.

Further exemplary embodiments relate to a method for controlling the current of an actuator. The method uses at least one control unit with a first terminal and a second terminal that can be switched independently of one another, wherein the actuator is controlled via the first terminal and/or the second terminal. The method further comprises the steps of:
- measuring a first current through the first terminal in the at least one control unit; and
- measuring a second current through the second terminal in the at least one control unit; and
- detecting at least one fault current on the basis of the measured first current and of the measured second current.

The two steps mentioned first (measurement of the first and of the second current) should be performed as simultaneously as possible in order to acquire the fault current correctly.

Exemplary embodiments of the present invention solve the above-mentioned technical problems using a principle for current measurement with actuators used in common, and by a proposed circuit as well as a possible logic for evaluation. Since the system can comprise two electronic control units that drive the actuator in common, one current measurement is in principle provided in each current-carrying path. This means that a current measurement is provided both in the high-side path and in the low-side path. In addition to a reliable regulation of the current of the actuators, there is thus also a possibility of measuring the fault or return currents. Both types of fault current are detected, which offers a high measure of security. It can thus be ensured that the respective actuator can be correctly driven by the respectively active electronic control unit.

The exemplary embodiments of the present invention will be understood better from the following detailed description and the appended drawings of the different exemplary embodiments, which nevertheless are not to be understood in such a way as to restrict the disclosure to the specific embodiments, but serve only for explanation and understanding.

DETAILED DESCRIPTION

Figure 1:
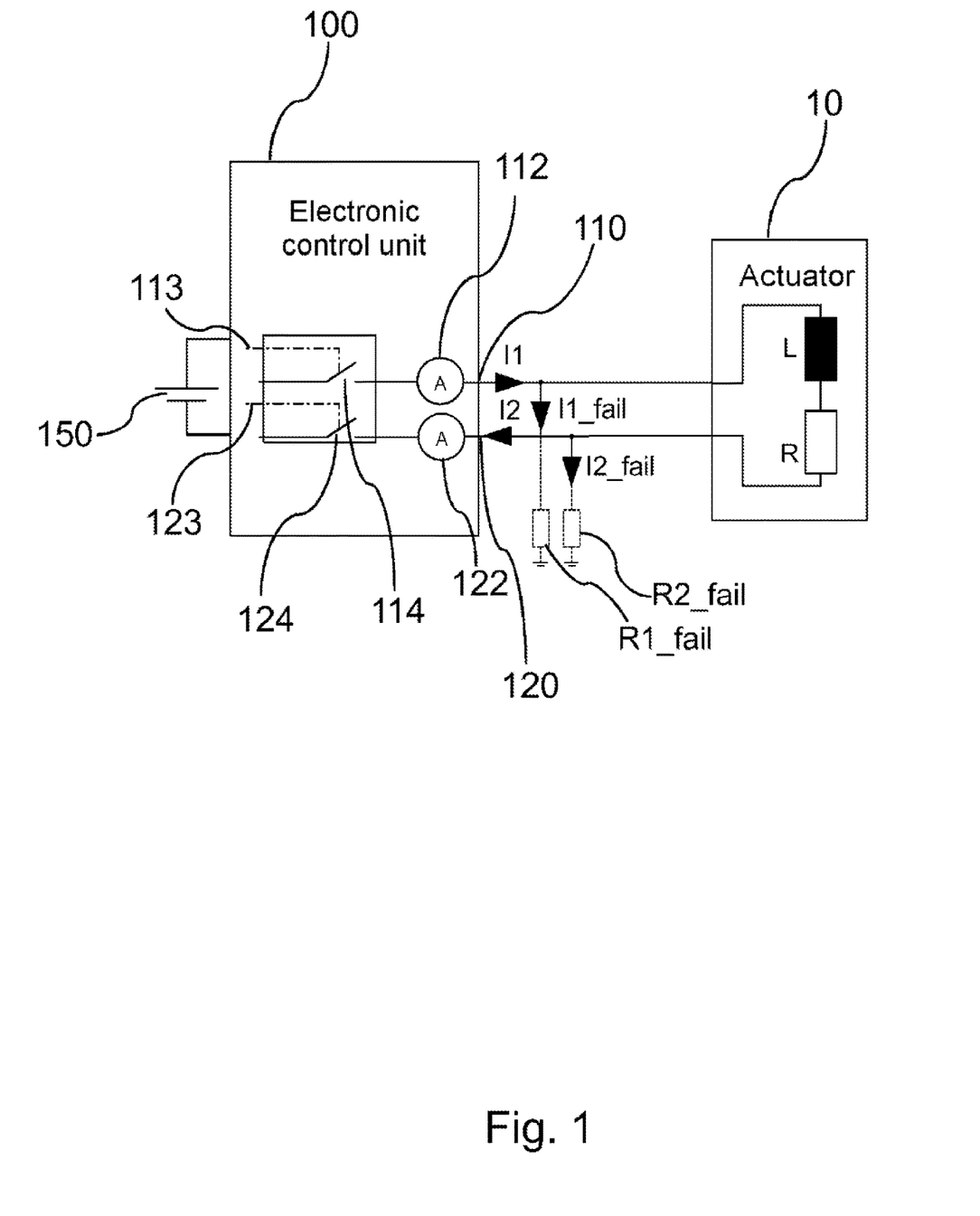
FIG. 1 shows a device for controlling the current of an actuator according to an exemplary example of the present invention.

FIG. 1 shows a device according to one exemplary embodiment of the present invention that is suitable or is provided for regulating the current of an actuator 10. The device comprises a control unit 100 with a first terminal 110 and a second terminal 120, and is or can be connected to a voltage supply 150. The control unit 100 also comprises a first current measuring apparatus 112 for measuring a first current I1 through the first terminal 110 and a second current measuring apparatus 122 for measuring a second current I2 through the second terminal 120.

The control unit 100 also comprises a first switch 114 (e.g. as a high-side switch) in order to switch a current path from the voltage supply 150 to the first terminal 110. The first switch 114 can be controlled by a first control connection 113 of a microcontroller (not shown). The control unit 100 also comprises a second switch 124 (e.g. as a low-side switch) in order to switch a further current path (e.g. a ground path) from the second terminal 120 to the voltage supply 150. The second switch 124 can also be controlled by a second control connection 123 of a microcontroller (not shown).

The device for controlling current is thus in particular configured to detect the fault current I1_fail that flows, for example, from the first terminal 110, and the fault current I2_fail that flows, for example, from the second terminal 120 (or at least their sum). The fault currents I1_fail, I2_fail can be taken to a ground level, but do not have to be. The different possible voltage levels to which the fault currents I1_fail, I2_fail can flow are parameterized by the fault resistors R1_fail or R2_fail in FIG. 1.

Since these fault currents I1_fail, I2_fail represent losses, and cannot be used in the current regulation for control of the actuator 10, the detection of the fault currents I1_fail, I2_fail allows the control unit 100 to compensate for the negative effect associated with them, or to give notification of them through a warning message.

It will be clear that the fault currents I1_fail and I2_fail, like the other currents, can in principle also be negative. This is, for example, possible when further voltage sources or other voltage potentials are present, something that is, for example, entirely possible in vehicles. But such introduced fault currents can also be reliably detected by the two current measuring apparatuses 112, 122, and appropriately taken into consideration.

Figure 2:
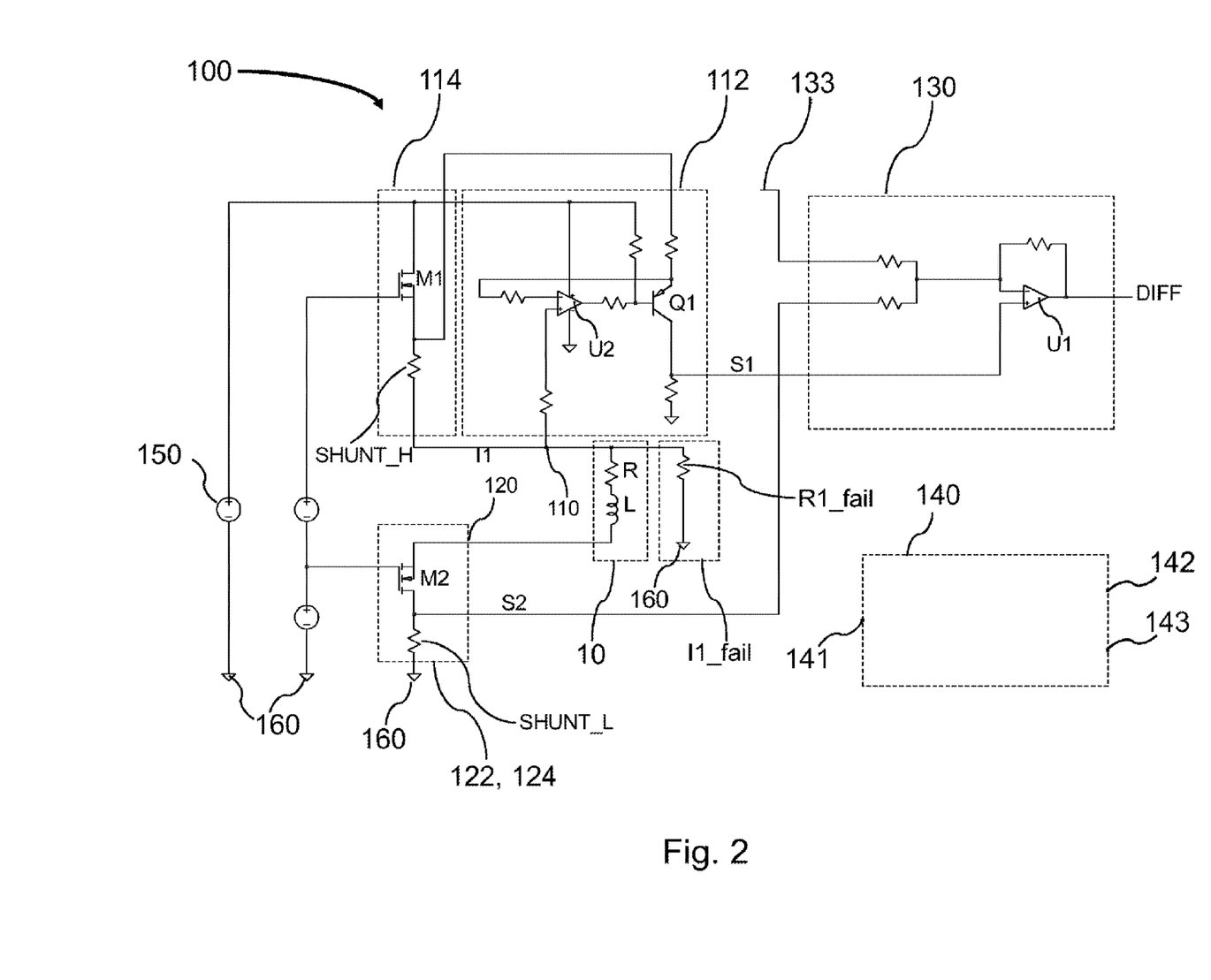
FIG. 2 shows further details of the device of FIG. 1.

FIG. 2 shows further details of the device for regulating current, as is illustrated in FIG. 1. Details of the implementation of the first and second current measuring apparatuses 112, 122 and the corresponding switches 114, 124, are in particular illustrated in FIG. 2.

The first switch 114 here connects to the voltage supply 150, which has one pole to ground 160, and comprises a transistor M1 as a switch element that, in response to a control signal, connects the first voltage supply 150 to a first shunt resistor SHUNT_H. A current signal is taken between the transistor M1 and the first shunt resistor SHUNT_H and supplied to the first current measuring apparatus 112 that is configured, for example, as a current mirror. The arrangement can also have a different sequence, wherein voltages are sampled upstream and downstream of the shunt and supplied to the current measuring apparatus. On the other side of the first shunt resistor SHUNT_H, the first current I1 is taken as an output signal to the first terminal 110 and also supplied to the first current measuring apparatus 112, which is configures as the current mirror. The shunt resistors used can also be MOSFETs or can comprise such a device.

The actuator 110 receives the first current I1 and comprises, for example in an equivalent circuit diagram, a resistor R and an inductor L. The actuator 10 connects the first terminal 110 to the second terminal 120, which represents an input for the second current measuring apparatus 122. The second current measuring apparatus 122 comprises a second transistor M2 as a switch, and a second shunt resistor SHUNT_L that connects the second transistor M2 on the other side to ground 160. The transistors M1 and M2 are driven by an appropriate control logic that is not illustrated in FIG. 2, or is only represented in the form of a voltage source that switches the transistors M1 and M2 on and off.

A fault current I1_fail is shown by way of example in FIG. 2, representing the fault current from the first terminal 110 to ground 160.

The current level 112 generates a first current signal S1 that is supplied to an evaluation circuit 130. The evaluation circuit 130 also receives a second current signal S2 from the second current sensor 122 that is taken from a node between the second transistor M2 and the second shunt resistor SHUNT_L. The first current signal S1 is compared in the evaluation circuit 130 to the second current signal S2, and is output as a difference signal DIFF. The comparison is made, for example, by a comparator U1, which receives the S1 signal at a first input and the S2 signal at a second input (said signals optionally being adjusted by further resistors). The evaluation circuit 130 can comprise a further input 133 with which additional, optional current signals from further shunt resistors can be received and evaluated.

The current mirror 112 also comprises a further comparator U2 that receives the current signal from both sides of the first shunt resistor SHUNT_H and compares them to one another, so that the first current signal S1 is output if a minimum threshold is exceeded. A transistor Q1 is present for this purpose in the current mirror, being driven by an output signal of the comparator U2, and connects the input of the current mirror to the output so that the first current signal S1 is then generated there if the transistor Q1 is closed.

Further resistors can be included between all said components, causing an adjustment of the respective voltage level.

A fault analysis unit 140 (fault logic) is also present in the exemplary embodiment of FIG. 2, having three inputs by way of example: a first input 141 at which the difference signal DIFF can be input, a second input 142 and a third input 143 to which the two-sided signal states of the actuator 10 can be applied. The fault analysis unit 140 is configured to control the actuator 10 appropriately on the basis of the difference signal DIFF at the output of the evaluation circuit 130, or to modify its drive or also to output a fault signal.

The current measurement illustrated takes place within an electronic control unit 100; concretely, this means that the current in the high-side path is measured by a shunt resistor SHUNT_H and a current mirror. The fault current can be determined from this circuit as described, and here a software logic (e.g. analysis circuit 140) is not necessarily required.

This current measurement can, in particular, be integrated into a control unit 100 that does not provide for multiple usage of actuators. The advantage for such a single-system control unit is that regulating the current from the actuator 10 can be represented, for which purpose the first signal S1 is evaluated by the microcontroller 140 and used for the regulation.

The actuator can, for example, be a sensor for a PCV actuator which, for example, controls a pneumatic pressure or monitors its setting.

Figure 3:
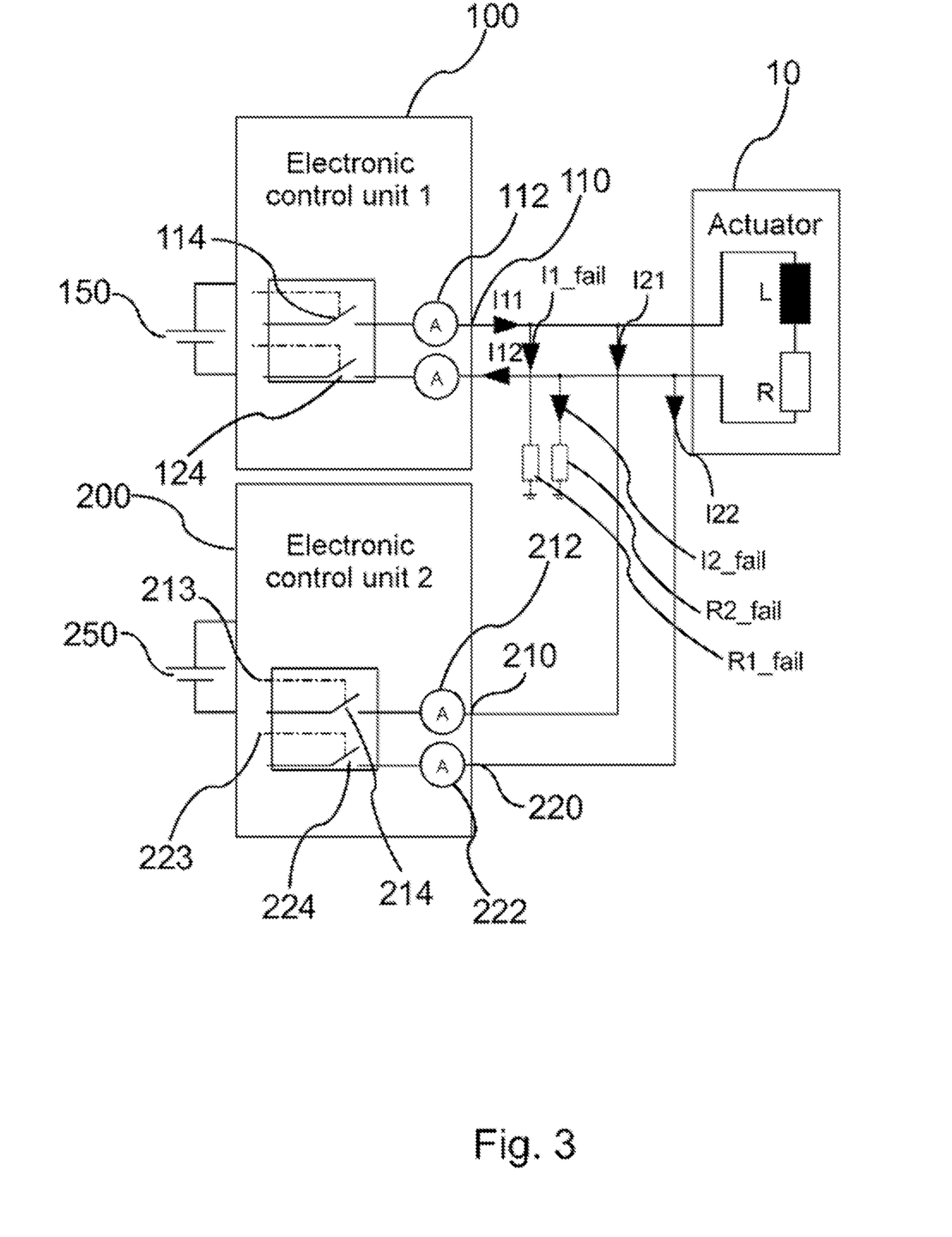
FIG. 3 shows a device for controlling the current of an actuator according to a further exemplary embodiment.

FIG. 3 shows a further exemplary embodiment for the device for controlling current comprising not just one electronic controller. According to this exemplary embodiment, the device comprises a first electronic control unit 100 and a second electronic control unit 200. Both control units 100, 200 can be configured in the same or a similar manner, and can comprise components that act in the same manner. In particular, the first control unit 100 and/or the second control unit 200 can comprise the same components as the control unit of FIG. 1. This is not, however, necessarily the case, and they can also be entirely different control units.

The first control unit 100 is, for example, supplied with electrical current by a first voltage source 150. The second control unit 200 is similarly supplied with electrical current from a second electrical voltage source 250.

Like the first control unit 100, the second control unit 200 comprises, by way of example, a high-side switch 214 that is driven by a high-side control line 213, and a low-side switch 224 that is driven via a low-side control line 223. The high-side switch 214 in turn connects the first terminal 210 to the voltage supply 250, and the low-side switch connects the second terminal 220 to the second voltage source 250. The high-side and low-side components can in turn also be referred to as the first/second switch/control connections.

It should be clear that further components can be included along the current paths; these have been omitted for the sake of clarity.

Like the first control unit 100, the second control unit 200 comprises a first current measuring apparatus 212 for measuring a first current I21 through the first terminal 210, and a second current measuring apparatus 222 for measuring a second current I22 through the second terminal 220.

In this way, the two control units 100, 200 comprise altogether four current measuring apparatuses 112, 122, 212, 222, that are configured to acquire the respective current through each of the four terminals 110, 120, 210, 220. Since the electrical current does not disappear (the losses are the fault currents), all of the currents, including the fault currents, can be acquired with these four current measuring apparatuses 112, 122, 212, 222. In this way it is possible to establish whether fault currents I1_fail, I2_fail flow away, for example to ground (e.g. via fault resistors R1_fail, R2_fail), between the actuator 10 and the first control unit 100 or between the actuator 10 and the second control unit 200. The fault currents I1_fail, I2_fail can also be shunts to a different potential.

Because the two control units 100, 200 described can be supplied from different voltage supplies 150, 250, the drive of the commonly used actuators 10 should not take place together at the same time. For that reason, in accordance with exemplary embodiments, one of the control units 100, 200 can be used as the primary control unit, and the other as the secondary control unit.

Voltage differences or ground offsets of the respective voltage sources 150, 250 could lead to compensating or reverse currents in the event of common drive, and these could damage the electronic control units 100, 200. By measuring the currents of all the high-side and low-side paths (through the terminals 110, 120, 210, 220) in accordance with exemplary embodiments, all of the currents and possible compensating currents can be acquired reliably through the formation of differences or sums. On this basis, the system can react appropriately and, for example, switch off the first control unit 100 (if it is used as the primary control unit), and use the secondary control unit (e.g. the second electronic control unit 200) for further control. The primary control unit 100, or its current-carrying paths, are thereby protected from reverse currents.

Figure 4:
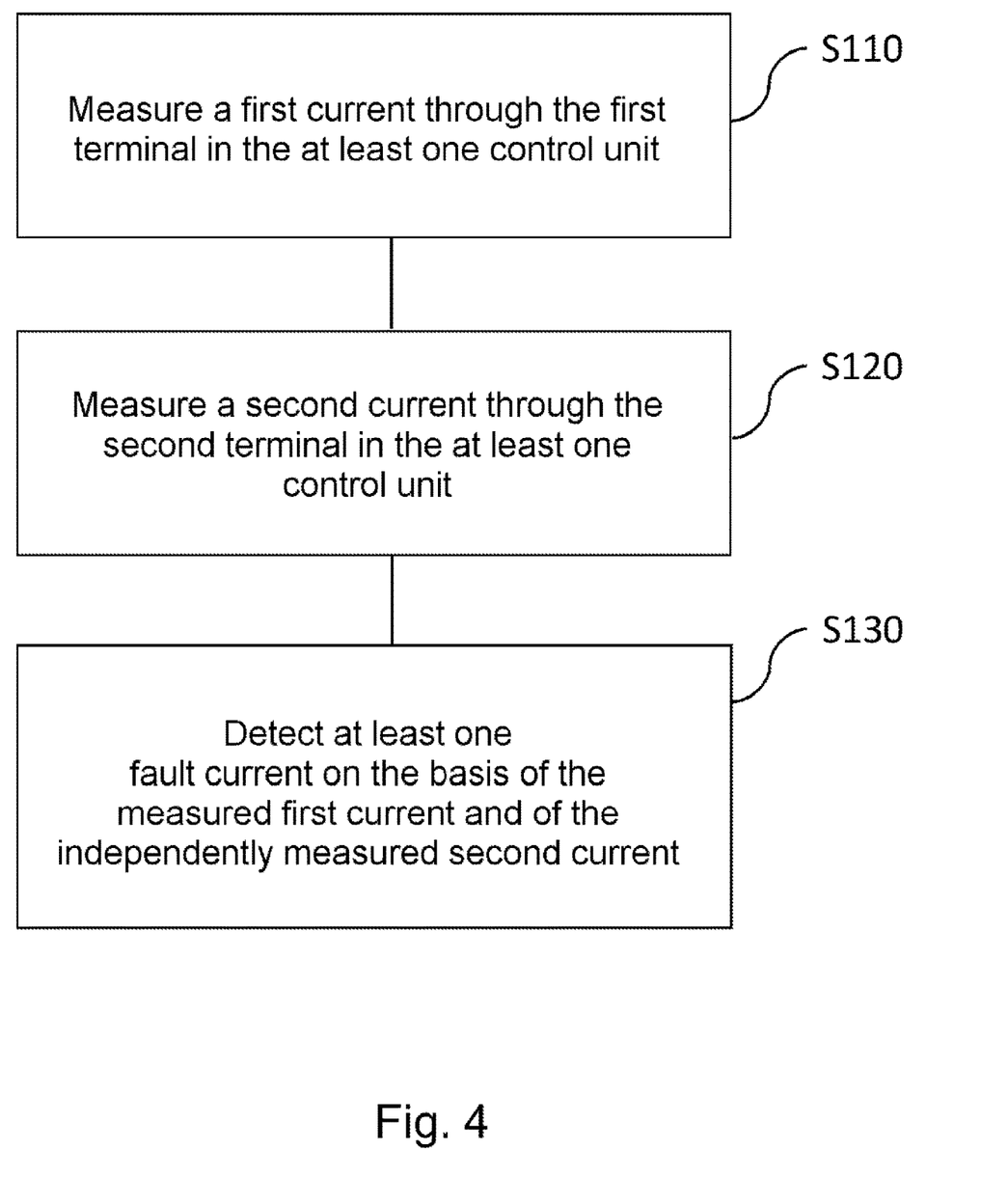
FIG. 4 shows a flow diagram for a method for controlling the current of an actuator according to a further exemplary embodiment.

FIG. 4 illustrates an exemplary method for controlling the current of an actuator according to a further exemplary embodiment. The method comprises:

measuring S110 a first current I1 through the first terminal 110 in the at least one control unit 100, 200;

measuring S120 a second current I2 through the second terminal 120 in the at least one control unit 100, 200; and detecting S130 at least one fault current I1_fail, I2_fail on the basis of the measured first current I1 and of the independently measured second current I2.

In a system in which the actuator 10 is driven by a plurality of control units 100, 200, the fault diagnosis and the fault handling can be optimized by this current measurement from both control units 100, 200. It is thus possible to analyze the measured fault current I1_fail, I2_fail, and, if appropriate, to tolerate it up to a defined limit. In response to the measurement, the primary control unit 100 can also be deliberately switched off, and the control transferred to the secondary control unit 200.

It is, moreover, possible to ascertain the current switch states (of the switches 114, 124, 214, 224) from both control units 100, 200. If, for example, the low-side paths through the second terminal 120, 220 of both control units 100, 200 are controlled to be closed, and a control unit now switches its high-side switch 114, 124, it is possible to recognize the low-side switch 124, 224 through which the current I12, I22 is returning on the basis of the current feedback signals. Using an appropriate logic, it is possible to establish in this way whether a fault is involved and should be reacted to accordingly.

The features of the invention disclosed in the description, the claims and the figures can, either individually or in any desired combination, be significant for the realization of the invention.

THE LIST OF REFERENCE SIGNS IS AS FOLLOWS:

| | |
|---|---|
| 10 | Actuator |
| 100, 200, 500 | Control unit(s) |
| 110, 210, 510 | First terminal (e.g. high-side) |
| 112, 212, 512 | First current measuring apparatus(es) |
| 113, 213, 513 | Control connections for first switch |
| 114, 214, 514 | First switch |
| 120, 220, 520 | Second terminal (e.g. low-side) |
| 122, 222 | Second current measuring apparatus(es) |
| 123, 223, 513, 523 | Control connections for second switch |
| 124, 224 | Second switch |
| 130 | Evaluation circuit |
| 140 | Analysis unit |
| 141, 142, 143 | Analysis unit connections |
| 150 | First voltage supply |
| 160 | Ground (or reference potential) |
| 250 | Second voltage supply |
| I1 | First current (e.g. on the high side) |
| I2 | Second current (e.g. on the low side) |
| I1_fail | First fault current |
| I2_fail | Second fault current |
| R1_fail, R2_fail | Fault resistors |
| U1, U2 | Comparator(s) |
| M1, M2, Q1 | Transistors |
| S1, S2 | Current signals/voltage values |
| DIFF | Difference signal |
| R, L | Resistor, inductor (in the equivalent circuit diagram of the actuator) |
| SHUNT_H, SHUNT_L | Shunt resistors |

The invention claimed is:

1. A device for controlling a current of an actuator, comprising:
at least one control unit having a first terminal;
a first switch;
a second terminal; and
a second switch for controlling a flow of current through the actuator via the first terminal and the second terminal independently of one another;
a first current measuring apparatus for measuring a first current through the first terminal; and
a second current measuring apparatus for measuring a second current through the second terminal;
wherein the first current measuring apparatus and the second current measuring apparatus are integrated into the at least one control unit for acquiring a fault current,
wherein the at least one control unit includes a first control unit and a second control unit, each of which is connectable to the actuator to drive the actuator independently via switchable terminals, and wherein the first control unit and the second control unit each include a first current measuring apparatus and a second current measuring apparatus to acquire respectively the first current through the respective first terminal and the second current through the respective second terminal independently, and
wherein the first control unit and the second control unit include a first switch for switching through the respective first terminal and a second switch for switching through the respective second terminal, wherein the evaluation unit includes logic to detect switching states of the first switch and the second switch through a measurement of currents through the two first current measuring apparatuses and through the two second current measuring apparatuses during the following switching states: (i) both first switches and one of the two second switches are closed; or (ii) both second switches and one of the two first switches are closed.

2. The device of claim 1, further comprising:
an evaluation unit to compare the first current and the second current, and to output a fault signal if the comparison indicates the fault current.

3. The device of claim 2, wherein the fault signal depends on a difference signal between the first current and the second current, and wherein the evaluation unit is configured to output the fault signal when the difference signal exceeds a predefined threshold value.

4. The device of claim 1, wherein the first terminal is a high-side terminal and the second terminal is a low-side terminal, wherein the first current measuring apparatus includes a current mirror and a first shunt resistor to generate a first voltage value, wherein the second current measuring apparatus includes a second shunt resistor to generate a second voltage value, and wherein the fault current is based on a difference between the first voltage value and the second voltage value.

5. The device of claim 1, wherein the first control unit is configured as the primary control unit, and the second control unit is configured as the secondary control unit, to prevent simultaneous drive of the actuator and, in the event of a failure or error in the first control unit, to transfer into a secure state and to enable the drive of the actuator by the second control unit.

6. The device of claim 1, wherein there is a first voltage supply for the first control unit and a second voltage supply for the second control unit that is independent from the first voltage supply.

7. An electronic control unit for a vehicle or a commercial vehicle, comprising:
a device for controlling a current of an actuator, including:
at least one control unit having a first terminal;
a first switch;
a second terminal; and
a second switch for controlling a flow of current through the actuator via the first terminal and the second terminal independently of one another;
a first current measuring apparatus for measuring a first current through the first terminal; and
a second current measuring apparatus for measuring a second current through the second terminal;
wherein the first current measuring apparatus and the second current measuring apparatus are integrated into the at least one control unit for acquiring a fault current,
wherein the at least one control unit includes a first control unit and a second control unit, each of which is connectable to the actuator to drive the actuator independently via switchable terminals, and wherein the first control unit and the second control unit each include a first current measuring apparatus and a second current measuring apparatus to acquire respectively the first current through the respective first terminal and the second current through the respective second terminal independently, and
wherein the first control unit and the second control unit include a first switch for switching through the respective first terminal and a second switch for switching through the respective second terminal, wherein the evaluation unit includes logic to detect switching states of the first switch and the second switch through a measurement of currents through the two first current measuring apparatuses and through the two second current measuring apparatuses during the following switching states: (i) both first switches and one of the two second switches are closed; or (ii) both second switches and one of the two first switches are closed.

8. A commercial vehicle, comprising:
an electronic control unit, including a device for controlling a current of an actuator, including:
at least one control unit having a first terminal;
a first switch;
a second terminal; and
a second switch for controlling a flow of current through the actuator via the first terminal and the second terminal independently of one another;
a first current measuring apparatus for measuring a first current through the first terminal; and
a second current measuring apparatus for measuring a second current through the second terminal;
wherein the first current measuring apparatus and the second current measuring apparatus are integrated into the at least one control unit for acquiring so that a fault current,
wherein the at least one control unit includes a first control unit and a second control unit, each of which is connectable to the actuator to drive the actuator independently via switchable terminals, and wherein the first control unit and the second control unit each include a first current measuring apparatus and a second current measuring apparatus to acquire respectively the first current through the respective first terminal and the second current through the respective second terminal independently, and
wherein the first control unit and the second control unit include a first switch for switching through the respective first terminal and a second switch for switching through the respective second terminal, wherein the evaluation unit includes logic to detect switching states of the first switch and the second switch through a measurement of currents through the two first current measuring apparatuses and through the two second current measuring apparatuses during the following switching states: (i) both first switches and one of the two second switches are closed; or (ii) both second switches and one of the two first switches are closed.

9. A method for controlling a current of an actuator using at least one control unit with a first terminal and a second terminal that are switchable independently of one another, the method comprising:
measuring a first current through the first terminal in the at least one control unit, wherein the actuator is controlled via the first terminal and/or the second terminal;
measuring a second current through the second terminal in the at least one control unit; and
detecting at least one fault current based on the measured first current and the independently measured second current;
wherein the at least one control unit includes a first control unit and a second control unit, each of which is connectable to the actuator to drive the actuator independently via switchable terminals, and wherein the first control unit and the second control unit each include a first current measuring apparatus and a second current measuring apparatus to acquire respectively the first current through the respective first terminal and the second current through the respective second terminal independently, and wherein the first control unit and the second control unit include a first switch for switching through the respective first terminal and a second switch for switching through the respective second terminal, wherein the evaluation unit includes logic to detect switching states of the first switch and the second switch through a measurement of currents through the two first current measuring apparatuses and through the two second current measuring apparatuses during the following switching states: (i) both first switches and one of the two second switches are closed; or (ii) both second switches and one of the two first switches are closed.

* * * * *